United States Patent
Baubet et al.

(10) Patent No.: US 7,820,017 B2
(45) Date of Patent: Oct. 26, 2010

(54) DIELECTRIC-LAYER-COATED SUBSTRATE AND INSTALLATION FOR PRODUCTION THEREOF

(75) Inventors: Carole Baubet, Aachen (DE); Klaus Fischer, Alsdorf (DE); Marcus Loergen, Herzogenrath (DE); Jean Christophe Giron, Aachen (DE); Nicolas Nadaud, Gentilly (FR); Eric Mattman, Paris (FR); Jean Paul Rousseau, Boulogne (FR); Alfred Hofrichter, Aachen (DE); Manfred Jansen, Geilenkirchen (DE)

(73) Assignee: Saint-Gobain Glass France, Courbevoie (FR)

( * ) Notice: Subject to any disclaimer, the term of this patent is extended or adjusted under 35 U.S.C. 154(b) by 208 days.

(21) Appl. No.: 10/562,451

(22) PCT Filed: Jun. 28, 2004

(86) PCT No.: PCT/FR2004/001652
§ 371 (c)(1), (2), (4) Date: May 26, 2006

(87) PCT Pub. No.: WO2005/000759
PCT Pub. Date: Jan. 6, 2005

(65) Prior Publication Data
US 2006/0234064 A1    Oct. 19, 2006

(30) Foreign Application Priority Data
Jun. 27, 2003   (FR)   ................... 03 07847

(51) Int. Cl.
  *C23C 14/34*   (2006.01)
(52) U.S. Cl. .................. 204/192.26; 204/192.23; 204/192.16
(58) Field of Classification Search ............ 204/192.11, 204/192.12, 192.15, 192.23, 192.26, 192.27, 204/192.28, 192.16, 192.3
See application file for complete search history.

(56) References Cited

U.S. PATENT DOCUMENTS 3,932,690 A    1/1976   Gliemeroth (Continued)

FOREIGN PATENT DOCUMENTS

BE    702 812    2/1968

(Continued)

OTHER PUBLICATIONS

S. Mitaray, et al., "Preparation De Couches Minces De $Ag_2O$ Et Action De Certains Gaz Sur Celles-CI", Thin Solid Films, vol. 46, No. 2, pp. 201-208, Oct. 17, 1977.

(Continued)

*Primary Examiner*—Rodney G McDonald
(74) *Attorney, Agent, or Firm*—Oblon, Spivak, McClelland, Maier & Neustadt, L.L.P.

(57) ABSTRACT

The invention relates to a substrate (1), especially a glass substrate, coated with at least one dielectric thin-film layer deposited by sputtering, especially magnetically enhanced sputtering and preferably reactive sputtering in the presence of oxygen and/or nitrogen, with exposure to at least one ion beam (3) coming from an ion source (4), characterized in that said dielectric layer exposed to the ion beam has a refractive index that can be adjusted according to the parameters of the ion source, said ion source being a linear source.

12 Claims, 2 Drawing Sheets

U.S. PATENT DOCUMENTS

| | | | |
|---|---|---|---|
| 4,488,780 A | | 12/1984 | Nicholson |
| 4,654,067 A | | 3/1987 | Ramus et al. |
| 4,691,077 A | * | 9/1987 | Gregory et al. ............. 136/256 |
| 4,851,095 A | * | 7/1989 | Scobey et al. .......... 204/192.12 |
| 4,927,246 A | | 5/1990 | Ito |
| 5,187,496 A | | 2/1993 | Yu |
| 5,239,406 A | | 8/1993 | Lynam |
| 5,454,919 A | | 10/1995 | Hill et al. |
| 5,532,062 A | | 7/1996 | Miyazaki et al. |
| 5,548,475 A | | 8/1996 | Ushikubo et al. |
| 5,569,362 A | * | 10/1996 | Lerbet et al. ........... 204/192.16 |
| 5,770,321 A | | 6/1998 | Hartig et al. |
| 5,962,080 A | | 10/1999 | Tan et al. |
| 5,981,076 A | | 11/1999 | Ojeda |
| 6,002,208 A | | 12/1999 | Maishev et al. |
| 6,033,471 A | * | 3/2000 | Nakanishi et al. ........... 117/108 |
| 6,086,727 A | | 7/2000 | Pinarbasi |
| 6,190,511 B1 | * | 2/2001 | Wei ....................... 204/192.11 |
| 6,284,360 B1 | | 9/2001 | Johnson et al. |
| 6,316,110 B1 | | 11/2001 | Anzaki et al. |
| 6,500,676 B1 | | 12/2002 | Ramberg |
| 6,503,636 B1 | | 1/2003 | Le Masson et al. |
| 6,596,399 B2 | * | 7/2003 | Veerasamy .................. 428/432 |
| 6,809,066 B2 | * | 10/2004 | Reade et al. ................ 505/411 |
| 2002/0086164 A1 | | 7/2002 | Anzaki et al. |
| 2002/0110934 A1 | | 8/2002 | Uchiyama et al. |
| 2002/0139772 A1 | | 10/2002 | Fenner |
| 2003/0064198 A1 | | 4/2003 | Scott et al. |
| 2005/0002081 A1 | | 1/2005 | Beteille et al. |

FOREIGN PATENT DOCUMENTS

| | | | |
|---|---|---|---|
| EP | 0 353 141 | | 1/1990 |
| EP | 0 363 045 | | 4/1990 |
| EP | 601 928 | | 6/1994 |
| EP | 0601928 | * | 6/1994 |
| EP | 0 753 438 | | 1/1997 |
| FR | 2 227 123 | | 11/1974 |
| FR | 2 829 723 | | 3/2003 |
| GB | 1 202 719 | | 8/1970 |
| JP | 3 115 142 | | 5/1991 |
| WO | WO 99/45415 | | 9/1999 |
| WO | 02/46491 | | 6/2002 |

OTHER PUBLICATIONS

U.S. Appl. No. 10/562,121, filed Dec. 23, 2005, Baubet, et al.
U.S. Appl. No. 10/564,501, filed Jan. 13, 2006, Giron, et al.
U.S. Appl. No. 10/563,322, filed Jan. 4, 2006, Giron, et al.
"Handbook of Sputter Deposition Technology".

* cited by examiner

DIELECTRIC-LAYER-COATED SUBSTRATE AND INSTALLATION FOR PRODUCTION THEREOF

CROSS-REFERENCE TO RELATED APPLICATIONS

The present application is a 371 application PCT/FR 2004/001652 filed on Jun. 28, 2004.

The present invention relates to the field of dielectric-based thin-film coatings, especially of the metal oxide, nitride or oxynitride type, which are deposited on transparent substrates, especially glass substrates, using a vacuum deposition technique.

The invention relates to a coated substrate, to a manufacturing process, to an installation for manufacturing and for applying the substrate and/or the process for producing glazing assemblies, especially double-glazing or laminated glazing assemblies, comprising at least one substrate according to the invention.

For the purpose of manufacturing what are called "functional" glazing assemblies, the usual practice is to deposit, on at least one of the substrates of which they are composed, a thin-film layer or a thin-film multilayer, so as to give the glazing assemblies optical (for example antireflection) properties, properties in the infrared (low emissivity) and/or electrical conduction properties. Layers based on an oxide and/or nitride dielectric are frequently used, for example on either side of a silver layer or a doped metal oxide layer, or as an interferential layer in multilayers in which low- and high-refractive index dielectrics alternate.

Layers deposited by sputtering are reputed to be somewhat less chemically and mechanically resistant than layers deposited by pyrolithic deposition. Thus, the experimental technique of ion-beam-assisted deposition has been developed in which a layer is bombarded with an ion beam, for example an oxygen or argon ion beam, which makes it possible to increase the density of the layer and its adhesion to the carrier substrate. This technique has for a long time been applicable only to very small sized substrates, owing to the problems posed in particular in terms of convergence between, on the one hand, the ion beam coming from a very localized source and, on the other hand, the particles resulting from the evaporation or sputtering of the target.

Document EP 601 928 discloses a sequential treatment of the deposited layer, by firstly depositing a layer in a sputtering chamber and then bombarding this dielectric layer after it has been deposited with a "low energy" ion beam coming from a point source, with an energy allowing the sputtering of the layer under the impact of the ions of the beam to be limited, typically of less than 500 eV and around one hundred eV.

This treatment is aimed essentially at increasing the physical and/or chemical durability of the layer, by densification of the layer, and makes it possible to achieve a lower surface roughness of the layer, favoring the subsequent "layering" of a layer subsequently deposited on top of it.

However, this treatment has the drawback of only being able to be carried out on a fully deposited layer.

Another drawback of this treatment is that it allows only densification of the layer thus treated and this densification causes an increase in the refractive index of the layer thus treated. The layers thus treated therefore cannot replace the untreated layers, because of their different optical properties, and mean that the multilayer systems, in which the material must be included, have to be completely redefined.

In addition, this treatment is not optimized for being carried out on a large substrate, for example for the production of an architectural glazing assembly.

Furthermore, this process is not at all compatible with the sputtering process, especially magnetically enhanced sputtering and preferably reactive sputtering in the presence of oxygen and/or nitrogen, especially because of the very different working pressures: at the time of this invention, the ion sources operated at pressures 10 to 100 times lower than the pressures used in the processes for sputtering, especially magnetically enhanced sputtering and preferably reactive sputtering in the presence of oxygen and/or nitrogen.

More recently, ion sources have been developed that are more compatible with processes for depositing thin films by sputtering, in particular by solving the problem of convergence of the particle beams and by improving the matching between the size and the geometry, on the one hand, of the cathode and, on the other hand, of the ion source. These systems, known as "linear sources", are described for example in documents U.S. Pat. No. 6,214,183 or U.S. Pat. No. 6,454,910.

Document WO 02/46491 describes the use of a source of this type for producing a functional silver oxide layer by sputtering using a silver target with bombardment by an oxygen ion beam. The ion beam is used to densify the silver material and convert it into a layer containing silver oxide. As a result of the densification, the silver oxide layer is capable of absorbing and/or reflecting a significant amount of the UV.

The object of the present invention is to remedy the drawbacks of the prior art and to provide novel thin-film materials that can be used to coat transparent substrates of the glass type, novel deposition processes and novel installations.

The invention relies on the fact that it is possible to deposit thin-film layers made of a dielectric, especially an oxide and/or nitride, with exposure to an ion beam by controlling the conditions so that the material of the final layer has an index adjusted to a target value, especially one less than or greater than the index of the material deposited conventionally, that is to say without subjecting the layer to at least one ion beam.

In this regard, the subject of the invention is a substrate, especially a glass substrate, as claimed in claim 1. The substrate according to the invention is coated with at least one dielectric thin-film layer deposited by sputtering, especially magnetically enhanced sputtering and preferably reactive sputtering in the presence of oxygen and/or nitrogen, with exposure to at least one ion beam coming from an ion source, and the dielectric layer deposited with exposure to the ion beam, having a refractive index that can be adjusted according to parameters of the ion source, and especially the voltage applied to its terminals, said ion source being a linear source.

The ion beam used to implement the present invention is what is called a "high-energy" beam, typically having an energy ranging from around several hundred eV to several thousand eV.

Advantageously, the parameters are controlled in such a way that the layer has an index very much less or very much greater than the index of a layer deposited without an ion beam, but which may also be close to the index of a layer deposited without an ion beam.

Within the meaning of the present description, the term "close" implies an index that differs from the reference value by at most around 5%.

The invention also makes it possible to create an index gradient in the deposited layer.

In a variant, said layer thus has an index gradient adjusted according to the parameters of the ion source.

Advantageously, for at least some of the dielectric materials that can be deposited, whatever the index modification produced, the density of the dielectric layer deposited on the substrate by sputtering with exposure to the ion beam is maintained with a similar or identical value.

Within the meaning of the present description, a "similar" density value differs from the reference value by at most around 10%.

The invention applies in particular to the production of a dielectric layer made of a metal oxide or silicon oxide, whether stoichiometric or nonstoichiometric, or made of a metal nitride or oxynitride or silicon nitride or oxynitride.

In particular, the dielectric layer may be made of an oxide of at least one element taken from silicon, zinc, tantalum, titanium, tin, aluminum, zirconium, niobium, indium, cerium, and tungsten. Among mixed oxides that can be envisioned, mention may in particular be made of indium tin oxide (ITO).

The layer may be obtained from a cathode made of a doped metal, that is to say one containing a minor element: as an illustration, it is common practice to use cathodes made of zinc containing a minor proportion of another metal, such as aluminum or gallium. In the present description, the term "zinc oxide" is understood to mean a zinc oxide possibly containing a minor proportion of another metal. The same applies to the other oxides mentioned.

For example, a zinc oxide layer deposited according to the invention has a refractive index that can be adjusted to a value of less than or equal to 1.95, especially around 1.35 to 1.95. Its density may be maintained at a value close to 5.3 $g/cm^3$ and especially at a value of around 5.3±0.2 $g/cm^3$, identical to the density of a ZnO layer deposited at low pressure, which is around 5.3 $g/cm^3$.

Zinc oxide layers having a refractive index adjusted to a value of less than 1.88 and similar to this value may be obtained by setting the sputtering conditions (especially the oxygen content of the atmosphere) so as to deviate slightly from the stoichiometry of the intended oxide so as to compensate for the impact of the ion bombardment.

The dielectric layer may also be made of silicon nitride or oxynitride. Such nitride dielectric layers may be obtained by setting the sputtering conditions (especially the nitrogen content of the atmosphere) so as to deviate slightly from the stoichiometry of the intended nitride, so as to compensate for the impact of the ion bombardment.

In general, the ion beam has the effect of improving the mechanical properties of the dielectric layer.

As a result of the ion bombardment, quantities of one or more bombarded species are introduced into the layer, in a proportion that depends on the nature of the gas mixture at the source and on the source/cathode/substrate configuration. As an illustration, a layer deposited under bombardment by an argon ion beam may include argon with a content of around 0.2 to 0.6 at %, especially about 0.45 at %.

Generating the ion beam via an ion source that uses soft iron cathodes or cathodes of any other material, especially paramagnetic material, which are eroded during the process, may be responsible for the presence of traces of iron in the deposited layer. It has been confirmed that iron present with a content of less than 3 at % or less is acceptable as it does not degrade the properties, especially optical or electrical properties, of the layer. Advantageously, the deposition parameters (especially the substrate transport speed) are adjusted so as to have an iron content of less than 1 at %.

By preserving the usual optical properties, it is very easy to incorporate the dielectric layers thus obtained into multilayers known for manufacturing what are called "functional" glazing assemblies, in particular using a silver-based metal functional layer.

Specific multilayers may be designed that incorporate a dielectric of index adjusted to a different value from the standard value.

Thus, the subject of the invention is a substrate coated with a multilayer in which a silver layer is deposited on top of said dielectric layer exposed to the ion beam. Another dielectric layer may then be deposited on top of this silver layer.

This configuration proves to be particularly advantageous when the lower dielectric layer is based on zinc oxide and/or tin oxide as they give rise to particularly well oriented growth of the silver layer on the oxide layer, with improved final properties. It is known that the presence of a zinc oxide layer beneath the silver has an appreciable influence on the quality of said silver layer. The formation of the silver layer on the zinc oxide layer deposited according to the invention results in a quite remarkable improvement.

The multilayer may thus have a surface resistance R of less than 6Ω/□, or even less than 2.1Ω/□, especially around 1.9Ω/□.

These substrates are thus particularly advantageous for producing low-emissivity or solar-controlled glazing assemblies, or else translucent elements with a high electrical conductivity, such as the screens for electromagnetic shielding of plasma display devices.

In these substrates, another dielectric layer may be placed on top of the silver layer. It may be chosen based on the abovementioned oxides or nitrides or oxynitrides. The other layer itself may or may not be deposited with exposure to an ion beam.

The multilayer may include at least two silver layers or even three or four silver layers.

Examples of multilayers that can be produced according to the invention comprise the following sequences of layers ... $ZnO^{(i)}$/Ag/oxide such as ZnO ...

... $Si_3N_4$/$ZnO^{(i)}$/Ag/oxide such as ZnO ...

... $Si_3N_4$/$ZnO^{(i)}$/Ag/$Si_3N_4$/(optionally an oxide) ...

... $Si_3N_4$/$ZnO^{(i)}$/Ag/$Si_3N_4$/$ZnO^{(i)}$/Ag/$Si_3N_4$ ...

... $Si_3N_4$/$ZnO^{(i)}$/Ag/$Si_3N_4$/$ZnO^{(i)}$/Ag/$Si_3N_4$/(oxide) ...

where $^{(i)}$ indicates that the layer is exposed to the ion beam and where a blocking metal layer may be inserted above and/or below at least one silver layer.

The substrate used could also be made of a plastic, especially a transparent plastic.

The subject of the invention is also a process for manufacturing a substrate as described above, i.e. a process for depositing a multilayer, in which at least one dielectric layer is deposited on the substrate by sputtering, especially magnetically enhanced sputtering and preferably reactive sputtering in the presence of oxygen and/or nitrogen, in a sputtering chamber, with exposure to at least one ion beam coming from an ion source. In the process according to the invention, the ion beam is created from a linear source and the refractive index of said dielectric layer exposed to the ion beam may be adjusted according to the parameters of the ion source.

The refractive index of the dielectric layer exposed to the ion beam may be decreased or increased relative to the index of this layer deposited without an ion beam.

Advantageously, for at least some of the dielectric materials to be deposited, whatever the index modification produced, the density of the dielectric layer deposited on the substrate by sputtering with exposure to the ion beam is maintained.

Exposure to the ion beam takes place in the sputtering chamber simultaneously with and/or sequentially after the deposition of the layer by sputtering.

The expression "simultaneously with" is understood to mean that the constituent material of the dielectric thin-film layer is subjected to the effects of the ion beam while it is yet to be completely deposited, that is to say that it has not yet reached its final thickness.

The term "sequentially after" is understood to mean that the constituent material of the dielectric thin-film layer is subjected to the effects of the ion beam when the layer has been completely deposited, that is to say after it has reached its final thickness.

In the variant with exposure simultaneously with deposition, the position of the ion source(s) is preferably optimized so that the maximum density of sputtered particles coming from the target is juxtaposed with the ion beam(s).

Preferably, to produce an oxide-based dielectric layer, an oxygen ion beam is created with an atmosphere containing very largely oxygen, especially 100% oxygen, at the ion source, whereas the atmosphere at the sputtering cathode is preferably composed of 100% argon.

In this variant, exposure to the ion beam takes place simultaneously with the deposition of the layer by sputtering. For this purpose, it is unnecessary to limit the ion energy as in the prior art; on the contrary, an ion beam with an energy between 200 and 2000 eV or even between 500 and 5000 eV, especially between 500 and 3000 eV, is advantageously created.

The ion beam may be directed onto the substrate and/or onto the sputtering cathode, especially along a direction or at a non-zero angle with the surface of the substrate and/or of the cathode respectively, such that the ion beam juxtaposes with the flux of neutral species ejected from the target by sputtering.

This angle may be around 10 to 80° relative to the normal to the substrate, measured for example vertically in line with the center of the cathode, and vertically in line with the axis of the cathode when it is cylindrical.

In the case of direct flux on the target, the ion beam coming from the source juxtaposes with the "racetrack" of the target created by the sputtering, that is to say the centers of the two beams, coming from the cathode and from the ion source respectively, meet at the surface of the substrate.

Advantageously, the ion beam may also be used outside the racetrack and directed toward the cathode, in order to increase the degree of use of the target (ablation). The ion beam can therefore be directed onto the sputtering cathode at an angle of ±10 to 80° relative to the normal to the substrate passing through the center of the cathode, and especially through the axis of the cathode when it is cylindrical.

The source/substrate distance, in a sequential or simultaneous configuration, is from 5 to 25 cm, preferably 10±5 cm.

The ion source may be positioned before or after the sputtering cathode along the direction in which the substrate runs (i.e. the angle between the ion source and the cathode or the substrate is respectively negative or positive relative to the normal to the substrate passing through the center of the cathode).

In a variant of the invention, an ion beam is created in the sputtering chamber using a linear ion source simultaneously with the deposition of the layer by sputtering, and then the deposited layer undergoes an additional treatment with at least one other ion beam.

The present invention will be more clearly understood on reading the detailed description below of illustrative but non-limiting examples and from the appended figures.

CONTROL EXAMPLE 1

Figure 1:
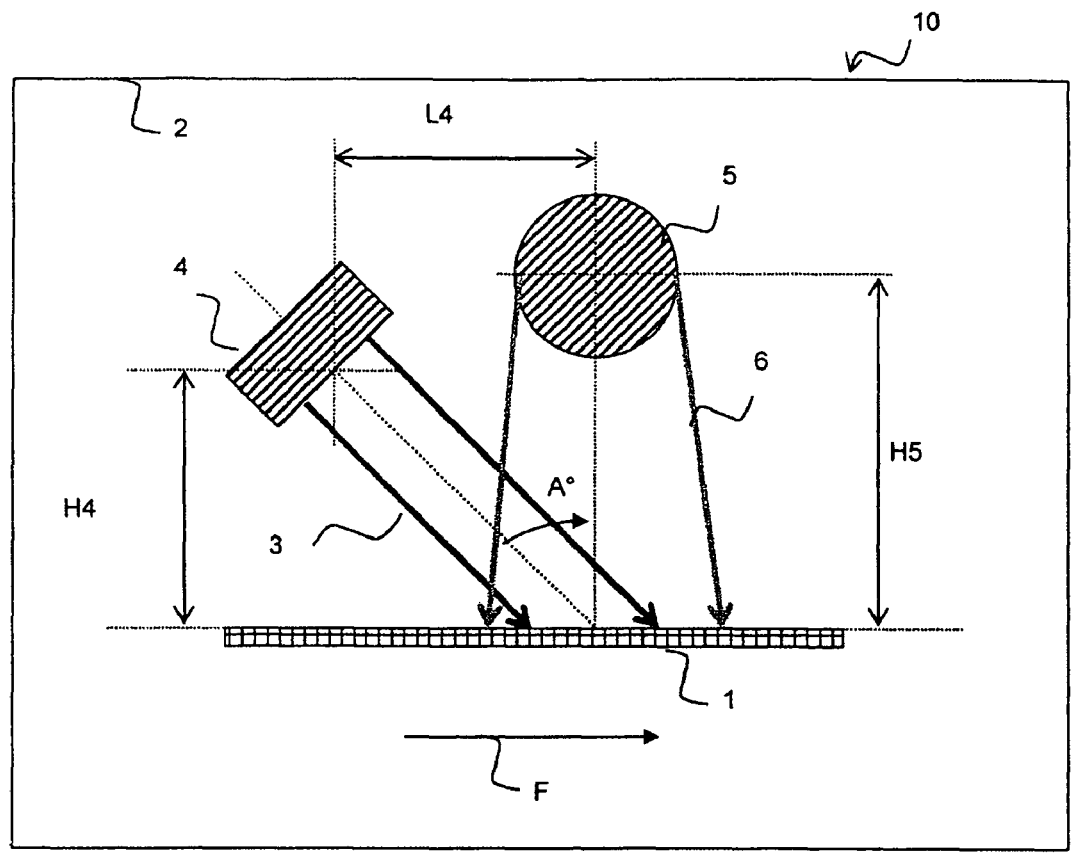
FIG. 1 illustrates a longitudinal sectional view of an installation according to the invention.

In this example, a thin dielectric zinc oxide layer 30 nm in thickness was applied to a glass substrate (1) using an installation (10) illustrated in FIG. 1.

The deposition installation comprised a vacuum sputtering chamber (2) through which the substrate (1) ran along conveying means (not illustrated here), along the direction and in the sense illustrated by the arrow F.

The installation (2) included a magnetically enhanced sputtering system (5). This system comprised at least one cylindrical rotating cathode (but it could also have been a flat cathode), extending approximately over the entire width of the substrate, the axis of the cathode being placed approximately parallel to the substrate. This sputtering system (5) was placed at a height H5 of 265 mm above the substrate.

The material extracted from the cathode of the sputtering system was directed onto the substrate approximately as a beam (6).

The installation (2) also included a linear ion source (4) emitting an ion beam (3), which also extended approximately over the entire width of the substrate. This linear ion source (4) was positioned at a distance L4 of 170 mm from the cathode axis, in front of the cathode with regard to the direction in which the substrate runs, at a height H4 of 120 mm above the substrate.

The ion beam (3) was directed at an angle A relative to the vertical to the substrate passing through the axis of the cathode.

This deposition was carried out using a known sputtering technique on the substrate running through a sputtering chamber past a rotating cathode, based on Zn containing about 2% by weight of aluminum in an atmosphere containing argon and oxygen. The run speed was at least 1 m/min.

The deposition conditions given in Table 1a below were adapted so as to create a slightly substoichiometric zinc oxide layer with an index of 1.88 (whereas a stoichiometric ZnO layer has an index of 1.93-1.95).

TABLE 1a

| | Deposition parameters: aluminum-doped zinc target | | | | Ion assistance parameters | | Ion assistance |
|---|---|---|---|---|---|---|---|
| | P [kW] | I [A] | U [V] | Gas [sccm] | U [V] | Gas [sccm] | angle Degrees |
| Without ion beam | 4.0 | 10 | 360 | 350(Ar) | 0 | 0 | |
| With ion beam | 4.0 | 10 | 360 | 350(Ar) | 500 ... 3000 | 120($O_2$) | 45 |

Firstly, the deposition was carried out without exposure to an ion beam and then secondly an oxygen ion beam (3) was applied, using the linear ion source (4), which was directed onto the substrate at an angle of 450 and the voltage M across the terminals of the ion source was varied up to 3000 eV.

Figure 2:
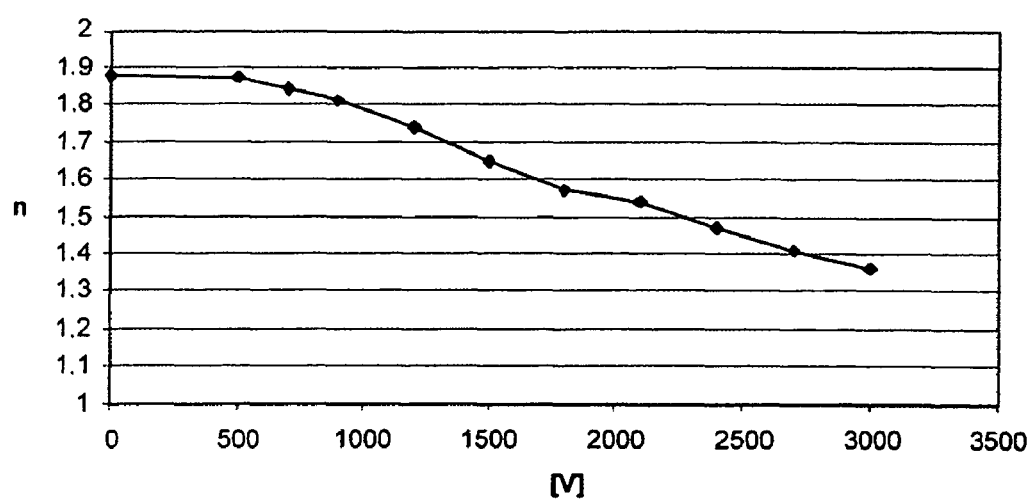
FIG. 2 illustrates the refractive indices obtained for the ZnO layer deposited according to the invention as a function of the voltage applied across the terminals of the ion source.

FIG. 2 illustrates the change in index n obtained.

The layer deposited without exposure to the ion beam and deposited with various voltages was analyzed by X-ray reflectometry in order to determine its density. Measured values are given in Table 1b below.

TABLE 1b

|  | Refractive index | Density (g/cm$^3$) |
|---|---|---|
| Without assistance by a linear ion beam | 1.88 | 5.3 |
| With assistance by a linear ion beam: U = 900 V | 1.81 | 5.3 |
| With assistance by a linear ion beam: U = 2100 V | 1.54 | 5.3 |
| With assistance by a linear ion beam: U = 3000 V | 1.35 | 5.3 |

Whatever the voltage applied across the terminals of the ion source and the index obtained, the density of the layer thus formed remains constant.

The refractive index of the ZnO layer was therefore lowered without introducing porosity into the layer, since its density did not decrease. The mechanical integrity of the ZnO layer was therefore unaffected by the treatment. This was confirmed by mechanical integrity tests.

SIMS measurement on the ZnO layers deposited with exposure to the ion beam showed that they had an iron content of less than 1 at % and Rutherford backscattering spectroscopy measurement showed that these layers contained a 0.45 at % amount of argon.

EXAMPLE 2

In this example, a glass substrate was coated with the following multilayer:
10 nm ZnO/19.5 nm Ag/10 nm ZnO, where the lower zinc oxide layer was obtained as in Example 1 with exposure to an ion beam.

As in Example 1, the lower layer was produced by adapting the residence time of the substrate in the chamber in order to reduce the thickness of the oxide layer to 10 nm.

The substrate was then made to run past a silver cathode in an atmosphere composed of 100% argon and then once again past a zinc cathode in an argon/oxygen atmosphere under the conditions of Control Example 1.

These properties are compared with those of a Control Example 2 in which the lower zinc oxide layer was produced without exposure to the ion beam.

The index of the ZnO layers beneath the silver and their density were measured. Values similar to those of Example 1 were obtained.

CONTROL EXAMPLE 3

In this example, the following multilayer was produced on a glass substrate:

| Substrate | | | | | |
|---|---|---|---|---|---|
| SnO$_2$ | TiO$_2$ | ZnO | Ag | NiCr | SnO$_2$ |
| 15 | 8 | 8 | 10 | 0.6 | 30 | in which the lower zinc oxide layer was obtained as in Example 1 with exposure to an ion beam.

The zinc oxide layer was produced as in Example 1 by adapting the residence time of the substrate in the chamber in order to reduce the thickness of the oxide layer to 8 nm.

Next, the substrate was made to run past a silver cathode in an atmosphere composed of 100% argon.

EXAMPLE 3

The same deposition conditions as those of Control Example 3 were used, except that a linear ion source was placed in the sputtering chamber and was used to create, simultaneously with the sputtering, an ion beam during production of the zinc-oxide-based layer, with an atmosphere at the source composed of 100% oxygen. The source was inclined so as to direct the beam onto the substrate at an angle of 30° and was positioned at a distance of about 14 cm from the substrate.

These modified deposition conditions made it possible to produce a zinc oxide layer having an index and a density substantially identical to those obtained with Example 1.

CONTROL EXAMPLE 4

A multilayer having the following layer thickness (in nanometers) was produced on a glass substrate, corresponding to the multilayer sold by Saint-Gobain Glass France under the brand name PLANISTAR:

| Substrate | | | | | | | | | | |
|---|---|---|---|---|---|---|---|---|---|---|
| SnO$_2$ | ZnO | Ag | Ti | ZnO | Si$_3$N$_4$ | ZnO | Ag | Ti | ZnO | Si$_3$N$_4$ |
| 25 | 15 | 9.0 | 1 | 15 | 56 | 15 | 13.5 | 1 | 15 | 21 |

EXAMPLE 4

A multilayer having the same thicknesses as Control Example 4 was produced under the same conditions as those of Control Example 4, except that a linear ion source was placed in the sputtering chamber and used to create, simultaneously with the sputtering, an ion beam during production of each zinc-oxide-based layer directly subjacent to each silver-based functional layer.

The atmosphere at the source was composed of 100% oxygen. The source was inclined so as to direct the beam onto the substrate at an angle of 30° and was positioned at a distance of about 14 cm from the substrate. The energy of the ion beam was, for each pass, around 3000 eV. The pressure inside the chamber was 0.1 µbar during the first pass and 4.3 µbar during the second pass, for a target power of 5.5 kW during the first pass and 10 kW during the second pass.

These modified deposition conditions made it possible to produce a zinc oxide layer having an index and a density substantially identical to those obtained with Example 1.

EXAMPLE 5

In this example, a titanium oxide layer 95 nm in thickness was deposited according to the invention on a glass substrate.

This deposition was carried out by sputtering onto the substrate, which moved through the same sputtering chamber as in Example 1, in an atmosphere at the sputtering cathode containing only argon. A linear ion source placed in the sputtering chamber was used to create, simultaneously with the sputtering, an ion beam, using an atmosphere at the source composed of 100% oxygen. The source was inclined so as to direct the beam toward the substrate at an angle A of 20° or 45°.

The deposition conditions are given in Table 2a.

TABLE 2a

| Cathode power (W) | Ion beam power (W) | Ion beam voltage (V) | Ion beam: oxygen flux (sccm) | Magnetron cathode: argon flux (sccm) | Ion beam angle A (°) |
|---|---|---|---|---|---|
| 2000 | 0 | 0 | 8 | 20 | 20 |
|  | 15 | 500 |  |  |  |
|  | 50 | 1000 |  |  |  |
|  | 220 | 2000 |  |  |  |
|  | 0 | 0 |  |  | 45 |
|  | 10 | 500 |  |  |  |
|  | 50 | 1000 |  |  |  |
|  | 220 | 2000 |  |  |  |

Firstly, the deposition was carried out without exposure to an ion beam and then secondly, an oxygen ion beam (3) was applied using the linear ion source (4), which was directed onto the substrate at an angle of 20 or 45°, and a voltage [V] of 500, 1000 eV and 2000 eV was applied across the terminals of the ion source.

Figure 3:
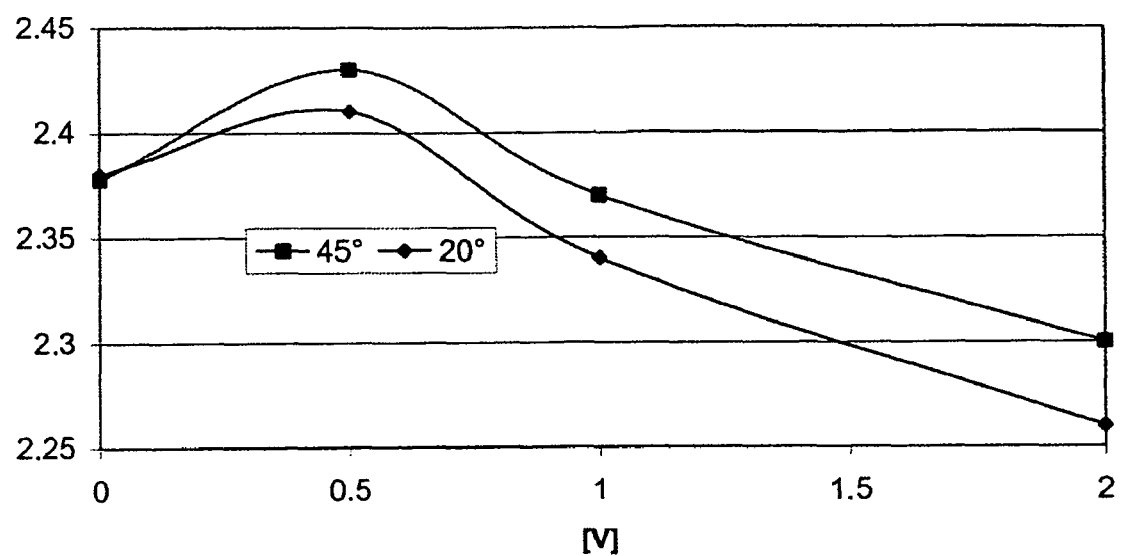
FIG. 3 illustrates the refractive indices obtained for the $TiO_2$ layer deposited according to the invention as a function of the voltage applied across the terminals of the ion source.

FIG. 3 illustrates the change in index obtained.

The layer deposited without exposure to the ion beam and deposited at various voltages was analyzed by X-ray reflectometry in order to determine its density. Measured values are given in Table 2b below.

TABLE 2b

|  | Refractive index | | Density (g/cm³) | |
|---|---|---|---|---|
|  | 20° | 45° | 20° | 45° |
| Without assistance by a linear ion beam | 2.38 | | 3.71 | |
| With assistance by a linear ion beam: U = 500 V | 2.41 | 2.43 | nm* | nm* |
| With assistance by a linear ion beam: U = 1000 V | 2.34 | 2.37 | 3.48 | 3.60 |
| With assistance by a linear ion beam: U = 2000 V | 2.26 | 2.3 | 3.38 | 3.50 |

*nm: value not measured

In this case, it may be seen that the index of the layer varies in a similar way to the density of the layer thus formed.

It was found that:
increasing the angle of inclination of the ion source makes it possible to increase the refractive index (slight increase in the density of the $TiO_2$ layer);
bombarding at low voltage (500 V), and therefore at low energy (250 eV), makes it possible to increase the refractive index (slight increase in the density); and
bombarding at high voltage (700-2000 V) makes it possible to lower the refractive index.

The mechanical integrity of the $TiO_2$ layer was therefore unaffected by the treatment. This was confirmed by mechanical integrity tests.

Rutherford backscattering spectroscopy measurements showed that the $TiO_2$ layer contained a 0.45 at % amount of argon.

The present invention has been described in the foregoing by way of example. Of course, a person skilled in the art would be capable of producing various alternative embodiments of the invention without thereby departing from the scope of the patent as defined by the claims.

The invention claimed is:

1. A process for depositing one or more layers on a substrate in a sputtering chamber comprising a sputtering system comprising a target, a linear ion source and a conveying system, comprising:
    conveying the substrate through the sputtering chamber,
    depositing at least one dielectric thin-film layer on the substrate by sputtering with the sputtering system comprising the target,
    generating at least one ion beam coming from the ion source in the sputtering chamber in the presence of the sputtering system comprising the target, and
    adjusting the refractive index of said dielectric layer by modifying the angle between the ion beam and the surface of the substrate and/or modifying the voltage applied to the ionic source,
    wherein the density of the dielectric layer deposited on the substrate is preserved.

2. The process as claimed in claim 1, wherein an oxygen ion beam is created.

3. The process as claimed in claim 1, wherein an ion beam is created with an energy of between 200 and 2000 eV.

4. The process as claimed in claim 1, wherein the refractive index of the dielectric layer exposed to the ion beam is lowered relative to the index of this layer deposited without the ion beam.

5. The process as claimed in claim 1, wherein the refractive index of the dielectric layer exposed to the ion beam is increased relative to the index of this layer deposited without the ion beam.

6. The process as claimed in claim 1, wherein the exposure to an ion beam takes place simultaneously with the deposition of the layer by sputtering.

7. The process as claimed in claim 1, wherein the exposure to an ion beam takes place sequentially after the layer has been deposited by sputtering.

8. The process as claimed in claim 1, wherein an ion beam is directed onto the substrate.

9. The process as claimed in claim 1, wherein an ion beam is directed onto at least one cathode.

10. The process as claimed in claim 1, wherein the dielectric layer is based on zinc oxide.

11. The process as claimed in claim 1, wherein an ion beam is created in the sputtering chamber from a linear ion source simultaneously with the deposition of the layer by sputtering and in that the deposited layer then undergoes an additional treatment with at least one other ion beam.

12. The process as claimed in claim 1, wherein the refractive index of said dielectric layer is decreased.

* * * * *

UNITED STATES PATENT AND TRADEMARK OFFICE
CERTIFICATE OF CORRECTION

PATENT NO. : 7,820,017 B2  Page 1 of 1
APPLICATION NO. : 10/562451
DATED : October 26, 2010
INVENTOR(S) : Carole Baubet et al.

It is certified that error appears in the above-identified patent and that said Letters Patent is hereby corrected as shown below:

On the title page, Item (86), the Application Filing Date is incorrect. Item (86) should read:

-- (86) PCT No.: PCT/FR2004/001652

§ 371 (c)(1),
(2), (4) Date: May 24, 2006 --

Signed and Sealed this
Twenty-eighth Day of December, 2010

David J. Kappos
*Director of the United States Patent and Trademark Office*